United States Patent [19]

Solomon

[11] Patent Number: 5,220,583
[45] Date of Patent: Jun. 15, 1993

[54] DIGITAL FM DEMODULATOR WITH A REDUCED SAMPLING RATE

[75] Inventor: James D. Solomon, Hoffman Estates, Ill.

[73] Assignee: Motorola, Inc., Schaumburg, Ill.

[21] Appl. No.: 253,174

[22] Filed: Oct. 3, 1988

[51] Int. Cl.$^5$ ............................................ H03D 3/18
[52] U.S. Cl. ...................................... 375/82; 329/315; 455/205
[58] Field of Search ............... 375/75, 103, 122.82; 381/29-31; 358/133, 135; 364/723, 724; 455/205, 206; 329/315, 318

[56] References Cited

U.S. PATENT DOCUMENTS

| | | | |
|---|---|---|---|
| 3,299,204 | 1/1967 | Cherry et al. | 375/122 |
| 4,270,026 | 5/1981 | Shenoi et al. | 364/723 |
| 4,375,013 | 2/1983 | Cointot et al. | 375/122 |
| 4,481,659 | 11/1984 | Adoul | 375/122 |
| 4,603,300 | 7/1986 | Welles, II et al. | 329/50 |
| 4,641,303 | 2/1987 | Vogl | 375/122 |
| 4,707,737 | 11/1987 | Adachi et al. | 358/133 |
| 4,733,403 | 3/1988 | Simone | 375/75 |
| 4,791,584 | 12/1988 | Greivenkamp, Jr. | 364/525 |
| 4,811,362 | 3/1989 | Yester, Jr. et al. | 375/75 |
| 4,852,035 | 7/1989 | Michener | 364/724.1 |
| 4,868,654 | 9/1989 | Juri et al. | 358/133 |

Primary Examiner—Stephen Chin
Attorney, Agent, or Firm—Steven G. Parmelee

[57] ABSTRACT

A method of recovering a frequency modulated signal wherein the frequency modulated information signal is sampled at a rate less than the Nyquist sampling rate, following which the under sampled signal can be demodulated to extract the original information signal.

10 Claims, 3 Drawing Sheets

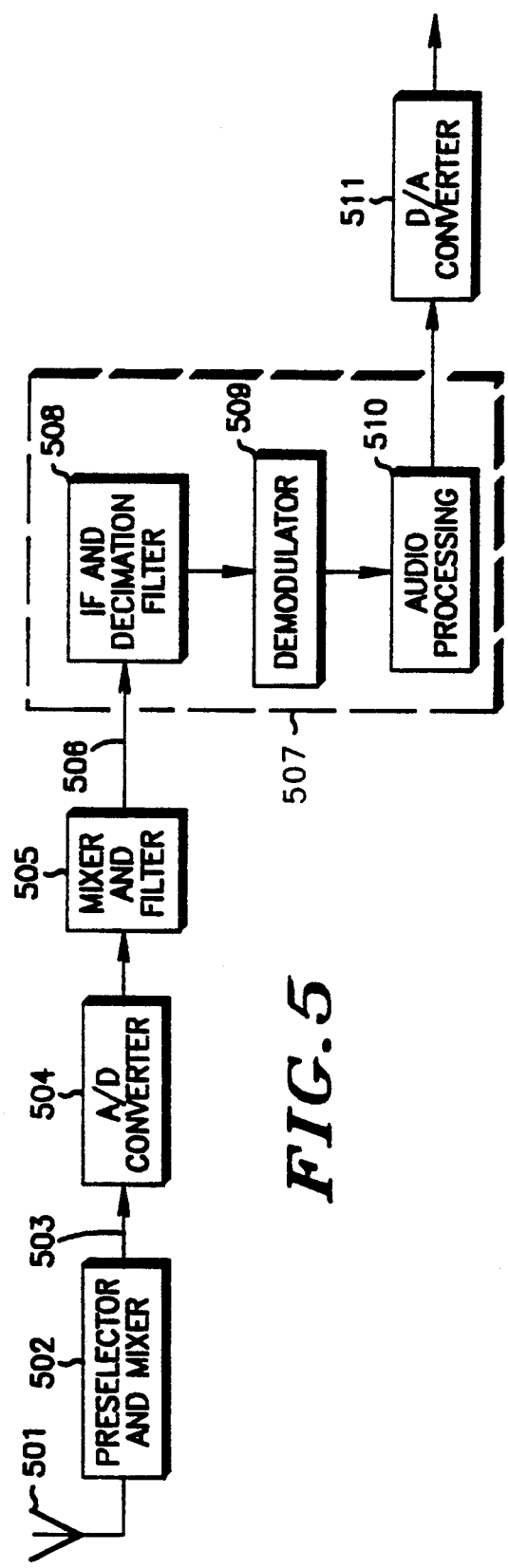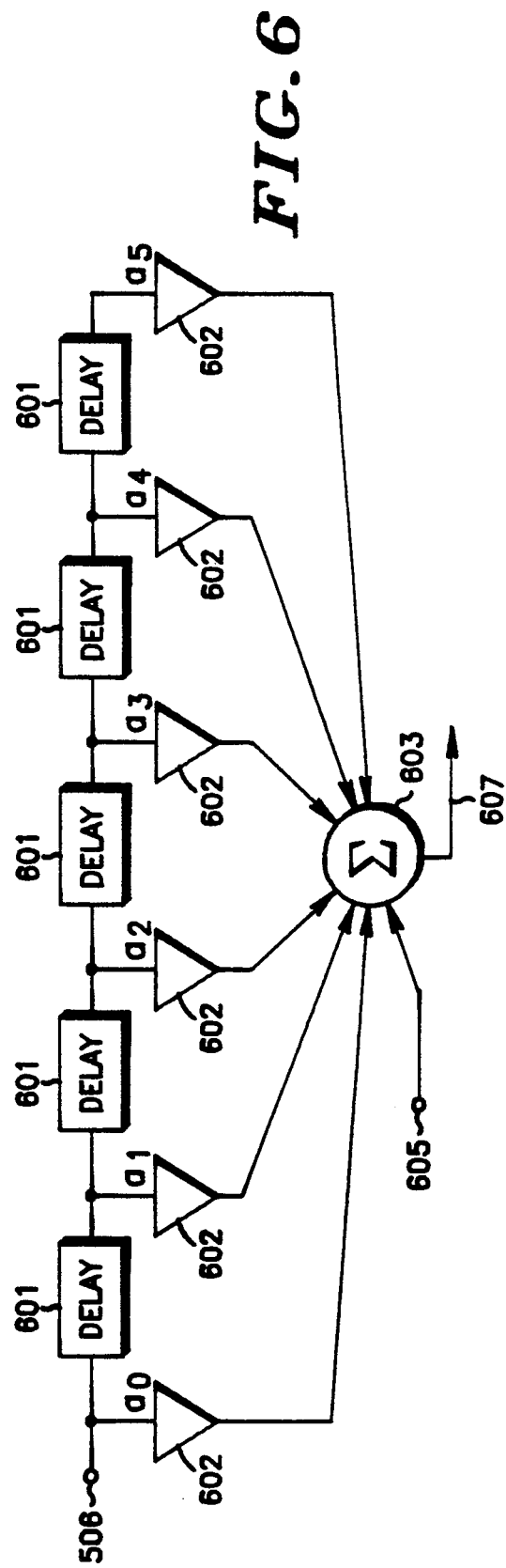

DIGITAL FM DEMODULATOR WITH A REDUCED SAMPLING RATE

TECHNICAL FIELD

This invention relates generally to FM radio communications.

BACKGROUND ART

Radio communications based upon frequency modulation of an information signal of interest are well known in the art. To date, most such radios have been analog based. Nevertheless some progress has been made in digitizing at least a portion of the reception, demodulation and/or audio processing functions of such a radio.

In order to facilitate such digital processing, the received FM signal must, at some point, be digitized through an appropriate sampling process. This signal may then be further processed to provide a digital signal suitable for demodulation and subsequent processing.

Well accepted sampling theory teaches that the signal to be sampled (see FIG. 1) should be sampled at frequency at least twice the bandwidth (+/−fFM in FIG. 1) of the original signal. Therefore, if we presume reception by the FM radio of an FM signal consigned to a plus/minus 12.5 kHz channel, an acceptable sampling rate of the FM signal (presuming zero IF) ($f_S$ in FIG. 2) must be 25 kHz or higher. If this criterion is not met, the frequency images can overlap one another (as depicted in FIG. 3), thereby giving rise to aliasing. According to traditional sampling theory, once a signal has been subjected to aliasing, it is theoretically impossible to reconstruct the original analog signal.

Because of this limitation, an FM radio that makes use of a digital signal processing platform must devote a significant amount of its resources towards processing of a significant number of samples that are representative of the original analog information signal.

SUMMARY OF THE INVENTION

Notwithstanding these teachings of the prior art, the applicant has discovered that a modulated signal, such as, for example, an angle modulated signal such as an FM signal, contained substantially within an allotted channel, which allotted channel has a predetermined bandwidth of approximately +/−fMAX, can be accurately represented in digitized form by sampling the FM signal at a sample rate $f_S$, which sample rate $f_S$ is less than $2f_{MAX}$. This digitized signal can then be demodulated to provide an accurate representation of the original analog information signal.

The Applicant obtains these benefits notwithstanding a sampling rate that is significantly less than the theoretical minimum presupposed by the prior art. Because of the reduced sampling rate, processing demands on the digital signal processing platform are reduced significantly thereby beneficially affecting current drain, and making the digital signal processor available for other necessary activities.

BRIEF DESCRIPTION OF THE DRAWINGS

FIG. 5 comprises a block diagram depiction of the invention;

FIG. 6 comprises a diagrammatic depiction of functional operation of the decimating IF filter of the invention;

BEST MODE FOR CARRYING OUT THE INVENTION

Figure 1:
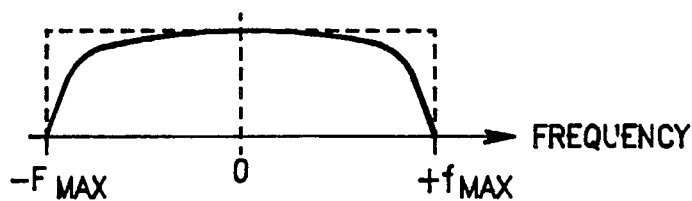
FIG. 1 comprises a spectrum depiction of an FM signal within an allotted channel.
Figure 2:
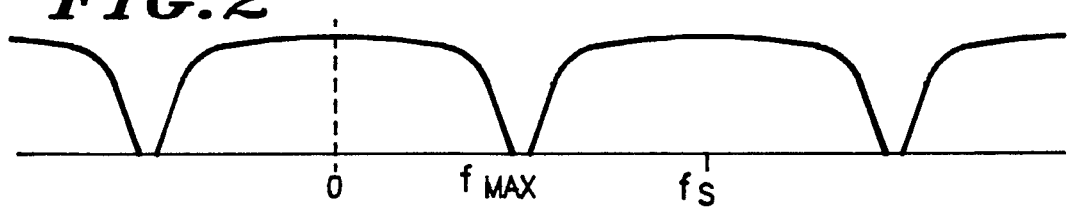
FIG. 2 comprises a first spectrum depiction of a signal as sampled.
Figure 3:
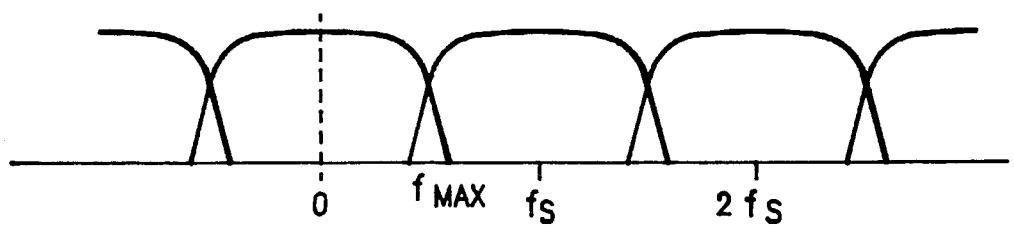
FIG. 3 comprises a second spectrum depiction of a signal as sampled.
Figure 4:
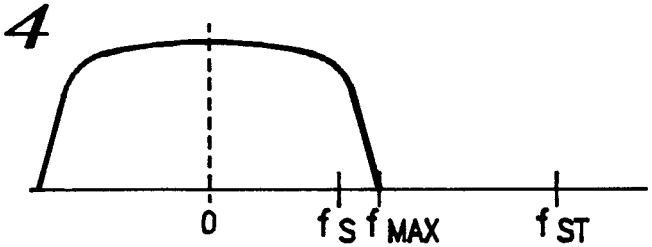
FIG. 4 comprises another spectrum depiction of an FM signal.

Referring momentarily to FIG. 1, this description will presume provision of an information signal that is frequency modulated on an allocated channel having a predetermined bandwidth of approximately +/−12.5 kHz (+/−fMAX). Referring now to FIG. 5, this FM signal will be received by an antenna (501) and provided to a preselector and mixer circuit (502) to be processed in a manner well understood in the prior art. In this embodiment, it can be presumed that the output (503) of the preselector and mixer block (502) will comprise the information signal as frequency modulated on a 450 kHz carrier. This signal (503) will then be provided to an analog to digital convertor (504). Preferably, this A to D convertor (504) will be a sigma delta convertor as described, for example, in U.S. Ser. No. 149,350 filed Jan. 28, 1988, incorporated herein by reference. This A to D convertor (504) can have a sampling rate of, for example, 14.4 MHz.

The output of this A to D convertor (504) is provided to a mixer and filter stage (505). In general, the mixer reduces the carrier to zero and decimates the sampling rate from 14.4 MHz to an output signal (506) having an effective sampling frequency of 33 ⅓ kHz.

The output (506) of the mixer and filter (505) is then appropriately provided to a digital signal processor (DSP)(507) as provided through use, for example, of a 56000 part as manufactured by Motorola, Inc. With appropriate programming, the DSP (507) provides a decimating IF filter function (508), a demodulator function (509), and subsequent audio processing (510) as may be appropriate. The decimating IF filter function (508) operates in general to reduce the effective sampling rate further to a sampling rate of 11 1/9 kHz and attenuate signals from adjacent FM channels. In effect, this function decimates two of every three available samples of the FM signal.

With momentary reference to FIG. 6, the decimating IF filter function can be seen generally represented by the numeral 508. The decimating IF filter function essentially comprises a finite impulse response configuration as well understood in the art. In effect, the decimating IF filter (508) receives the output (506) of the mixer and filter and provides this signal to a delay line, each unit (601) providing 1 sample of delay (for purposes of illustration, 5 such unit delays (601) are depicted in FIG. 6; in an actual operable environment, this number may be varied as appropriate to achieve the desired result in a manner well understood by those skilled in the art). The output of each unit delay (601), as well as the original incoming signal, are passed through gain stages (602) before being provided to a summing junction (603). Each gain stage (602) has a gain ($a_0$–$a_5$) associated therewith that provides the desired filter function in a manner well understood in the art.

The summation block (603) functions to sum the output of all of the gain stages (602) and provides this sum at an output (604) which is then provided to the demodulator block (509) (FIG. 5).

As described earlier, the signal being provided to the input of the decimating IF filter stage (508) comprises a digital signal representing the FM signal at an effective sampling rate of 33 ⅓ kHz, thereby providing a sample every 30 microseconds. Through appropriate software control, an appropriate control signal (605) can be provided to cause the output of the summation process (603) to be released only every third summation event. As a result, two summation events will be lost for every three, with the resulting output occurring every 90 microseconds for an effective sampling rate of the FM signal of 11 1/9 kHz. (An object code listing of a program to accomplish this filter and decimation function is set forth in an attached appendix. Such a program would of course function under the control of an appropriate scheduling program in accordance with well understood prior art technique.)

Referring again to FIG. 5, this reduced sampling rate signal is provided to a demodulator (509) which can be as described in U.S. Pat. No. 4,675,882, the contents of which are incorporated herein by reference. The resulting demodulated information signal can then be submitted to appropriate audio processing (510) and thereafter converted into an analog signal (511) which constitutes a reconstruction of the original analog information signal prior to modulation and transmission to the radio.

Figure 7:
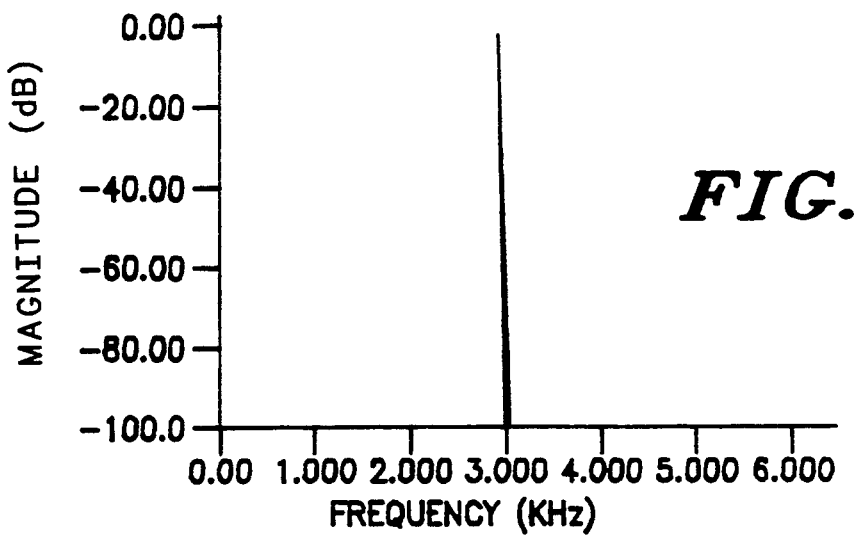
FIG. 7 comprises a depiction of the spectrum of an original information signal, and also comprises a depiction of the spectrum of the demodulated signal.
Figure 8:
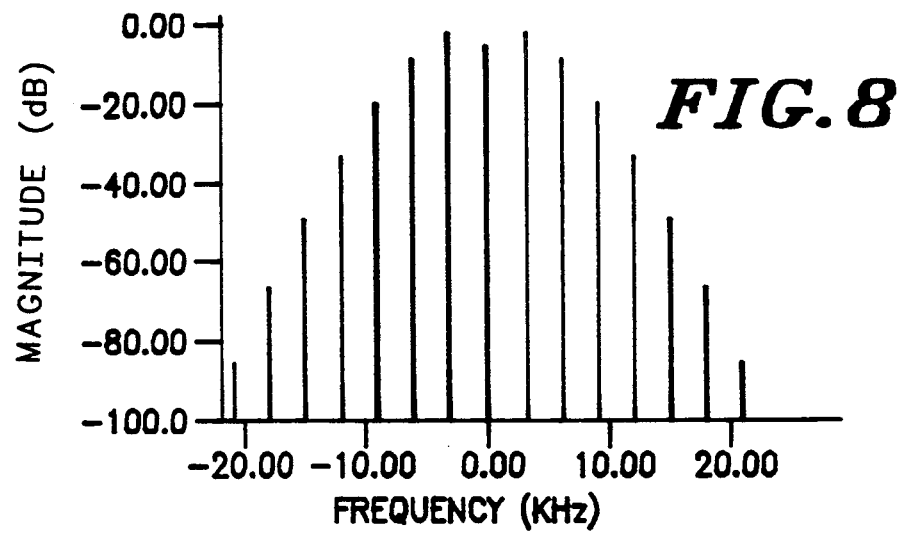
FIG. 8 comprises a depiction of the spectrum relative to a carrier of the information signal as frequency modulated on an appropriate carrier.

Referring now to FIG. 7, and for purposes of illustration, it will be presumed that a 3 kHz tone comprises the information signal of interest as depicted. This tone will be frequency modulated, at 5 kHz deviation, upon a preselected carrier as depicted in FIG. 8.

Figure 9:
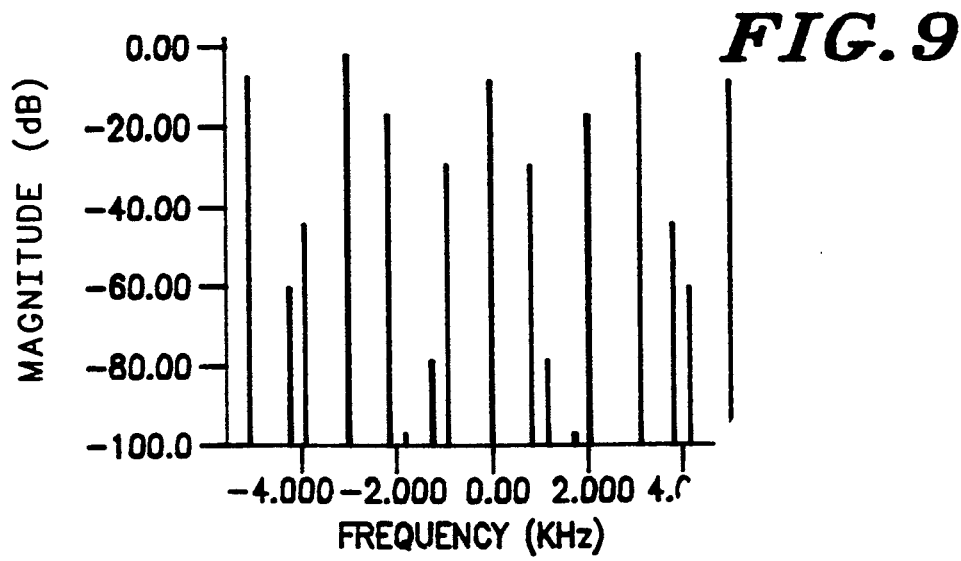
FIG. 9 comprises a depiction of the spectrum of the information signal as frequency modulated and as under sampled by the invention.

FIG. 9 depicts the spectrum of the information signal of interest as frequency modulated and as sampled at the 11 1/9 kHz sampling rate in the DSP (507) as described above. FIG. 9 in particular depicts the output of the decimating IF filter (508) as will then be provided to the demodulator stage (509). The demodulator block (509), despite provision of a significantly under sampled signal, will provide at its output, as the demodulated information signal, the signal represented in FIG. 7; i.e., a signal substantially identical to that originally provided as the analog information signal.

Although traditional sampling theory would hold that the sampling of the signal in question should be maintained, in the example provided, at or above 25 kHz, the Applicant has discovered that a sampling rate significantly thereunder (in the example provided, 11 1/9 kHz) will suffice to provide a substantially exact replica of the original analog signal.

There does appear to be a limit as to how low the sampling rate can be. Presuming that the message signal has some maximum frequency ($f_{MAX}$) and modulation occurs with a peak frequency deviation ($f_D$), then the minimum sampling frequency $f_S$ appears to be 2 times the greater of either $f_M$ or $f_D$. In the case of conventional audio RF channels having 25 kHz channels, where $f_M$ typically equals 3 kHz and fD equals 5 kHz, the minimum sampling rate appears to be 10 kHz.

I claim:

1. A method of recovering an information signal that has been frequency modulated at a peak frequency deviation $f_p$ on a radio frequency carrier and contained substantially within an allotted communication channel to provide a frequency modulated signal, said allotted communication channel having a predetermined bandwidth of approximately plus/minus $f_{MAX}$, said method comprising the steps of:
    A) sampling said frequency modulated signal at a sample rate $f_S$, wherein said sample rate $f_S$ is:
        i) less than $2f_{MAX}$; but
        ii) greater than $2f_D$; to provide a resultant sampled signal that includes aliased information;
    B) demodulating said resultant sampled signal to recover said information signal without degradation that is attributable to the sample rate $f_S$.

2. The method of claim 1 wherein said modulated signal comprises an FM signal, wherein said allotted channel has associated therewith a peak frequency deviation $f_D$ and a maximum frequency $f_M$, and wherein said sampling rate $f_S$ is also no less than two times the greater of $f_M$ and $f_D$.

3. The method of claim 1 wherein $f_{MAX}$ is substantially equal to 25 kHz and $f_S$ is substantially equal to 11 1/9 kHz.

4. The method of claim 1 wherein said modulated signal is sampled at a first sampling rate higher than said sampling rate $f_S$, and then further decimated down to said sampling rate $f_S$.

5. The method of claim 1 wherein said modulated signal comprises an angle modulated signal.

6. The method of claim 1 wherein said modulated signal comprises an FM signal.

7. A device for recovering an information signal that has been frequency modulated at a peak frequency deviation $f_D$ on a radio frequency carrier and contained substantially within an allotted communication channel to provide a modulated signal, said allotted communication channel having a predetermined bandwidth of approximately plus/minus $f_{MAX}$, said device comprising:
    A) sampling means for sampling said frequency modulated signal at a sample rate $f_S$, wherein said sampling rate $f_S$ is;
        i) less than $2f_{MAX}$; but
        ii) greater than $2f_D$;
    to provide a resultant sampled signal that includes aliased information;
    B) demodulating means for demodulating said resultant samples signal to recover said information signal without degradation that is attributable to the sample rate $f_S$.

8. The device of claim 7 wherein said modulated signal comprises a frequency modulated signal.

9. A radio for use with an information signal that has been frequency modulated at a peak frequency deviation $f_D$ on a radio frequency carrier and contained substantially within an allotted communication channel to provide a modulated signal, said allotted communication channel having a predetermined bandwidth of approximately plus/minus $f_{MAX}$, said radio comprising:
    A) receiving means for receiving said modulated signal;
    B) sampling means for sampling said modulated signal at a sample rate $f_S$,
    wherein said sample rate $f_S$ is;

i) less than $2f_{MAX}$; but
ii) greater than $2f_D$; to provide a resultant sampled signal that includes aliased information;

C) demodulating means or demodulating said resultant sampled signal to recover said information signal without degradation that is attributable to the sample rate $f_S$.

10. The radio of claim 9 wherein said modulated signal comprises a frequency modulated signal.

* * * * *

UNITED STATES PATENT AND TRADEMARK OFFICE
CERTIFICATE OF CORRECTION

PATENT NO. : 5,220,583
DATED : June 15, 1993
INVENTOR(S) : James D. Solomon

It is certified that error appears in the above-identified patent and that said Letters Patent is hereby corrected as shown below:

Column 4, line 52, "samples" should be --sampled--.

Signed and Sealed this

Fifth Day of April, 1994

Attest:

BRUCE LEHMAN

Attesting Officer

Commissioner of Patents and Trademarks